United States Patent
Hustad et al.

(10) Patent No.: US 10,202,479 B2
(45) Date of Patent: Feb. 12, 2019

(54) POLY(CYCLOHEXYLETHYLENE)-POLYACRYLATE BLOCK COPOLYMERS, METHODS OF MANUFACTURE THEREOF AND ARTICLES COMPRISING THE SAME

(71) Applicants: Regents of the University of Minnesota, Minneapolis, MN (US); Dow Global Technologies LLC, Midland, MI (US)

(72) Inventors: Phillip Dene Hustad, Watertown, MA (US); Frank Steven Bates, Saint Louis Park, MN (US); Marc Andrew Hillmyer, Minneapolis, MN (US); Justin Glenn Kennemur, Minneapolis, MN (US)

(73) Assignees: REGENTS OF THE UNIVERSITY OF MINNESOTA, Minneapolis, MN (US); DOW GLOBAL TECHNOLOGIES LLC, Midland, MI (US)

( * ) Notice: Subject to any disclaimer, the term of this patent is extended or adjusted under 35 U.S.C. 154(b) by 193 days.

(21) Appl. No.: 13/912,797

(22) Filed: Jun. 7, 2013

(65) Prior Publication Data

US 2014/0360975 A1 Dec. 11, 2014

(51) Int. Cl.
 C08F 293/00 (2006.01)
 C08L 33/04 (2006.01)
 (Continued)

(52) U.S. Cl.
 CPC ........ *C08F 293/005* (2013.01); *G03F 7/0002* (2013.01); *C08F 2438/01* (2013.01)

(58) Field of Classification Search
 CPC . C08F 220/18; C08F 212/08; H01L 21/31138
 (Continued)

(56) References Cited

U.S. PATENT DOCUMENTS 4,098,980 A 7/1978 Markle et al.
6,294,614 B1 9/2001 Kataoka et al.
(Continued)

FOREIGN PATENT DOCUMENTS

CA 2373712 A1 11/2000
JP H05310867 A 11/1993
(Continued)

OTHER PUBLICATIONS

"Flory-Fox equation", Wikiepedia , date unknown.*
(Continued)

*Primary Examiner* — Thomas T Pham
(74) *Attorney, Agent, or Firm* — Cantor Colburn LLP

(57) ABSTRACT

Disclosed herein is a block copolymer comprising a first block derived from a cyclo-alkyl vinyl monomer, a hydrogenated vinyl aromatic polymer or a hydrogenated vinyl pyridine polymers; and a second block derived from an acrylate monomer. Disclosed herein too is a method comprising reacting a first block derived from a cyclo-alkyl vinyl monomer, a hydrogenated vinyl aromatic polymer or a hydrogenated vinyl pyridine polymers with an initiator to form a macroinitiator; and polymerizing a second block onto the first block to form a block copolymer; where the second block is derived by polymerizing an acrylate monomer; and where the block copolymer has a chi parameter of greater than or equal to about 0.05, when measured at a temperature of 200° C. to 210° C.; where the chi parameter is a measure of interactions between the first block and the second block of the copolymer.

10 Claims, 5 Drawing Sheets

(51) Int. Cl.
   *G03F 7/00* (2006.01)
   *B44C 1/22* (2006.01)
   *C03C 15/00* (2006.01)
   *C03C 25/68* (2006.01)
   *C23F 1/00* (2006.01)

(58) Field of Classification Search
   USPC .......................................................... 216/41
   See application file for complete search history.

(56) References Cited

U.S. PATENT DOCUMENTS

| | | | |
|---|---|---|---|
| 8,999,631 | B2 | 4/2015 | Senzaki et al. |
| 2005/0098914 | A1 | 5/2005 | Varma et al. |
| 2008/0003288 | A1* | 1/2008 | Bromberg et al. ............ 424/486 |
| 2008/0213956 | A1 | 9/2008 | Black et al. |
| 2009/0253867 | A1* | 10/2009 | Takahashi ............ C08F 293/005 525/227 |
| 2010/0113698 | A1 | 5/2010 | Walton |
| 2010/0173245 | A1 | 7/2010 | Wang et al. |
| 2010/0311849 | A1 | 12/2010 | Gonzalez Montiel et al. |
| 2012/0228262 | A1* | 9/2012 | Tanaka et al. ................... 216/49 |
| 2013/0210231 | A1* | 8/2013 | Senzaki et al. ............... 438/694 |
| 2016/0053041 | A1 | 2/2016 | Hustad et al. |

FOREIGN PATENT DOCUMENTS

| | | |
|---|---|---|
| JP | H10130348 A | 5/1998 |
| JP | 2001115082 A | 4/2001 |
| JP | 2001348404 A | 12/2001 |
| JP | 2010230891 A | 10/2010 |
| WO | 9749736 | 12/1997 |

OTHER PUBLICATIONS

Bang, J; Jeong, U.; Ryu, D. Y.; Russell, T. P.; Hawker, C. J., "Block Copolymer Nanolithography: Translation of Molecular Level Control to Nanoscale Patterns" Adv. Mater. 2009, 21, 4769-4792.

Bates, F. S.; Fredrickson, G. H., "Block Copolymers-Designer Soft Materials" Phys. Today 1999, 52, 32-38.

Hadjichristidis, N.; Iatrou, H.; Pispas, S.; Pitsikalis, M. J., "Anionic Polymerization: High Vacuum Techniques" Polym. Sci. Part A: Polym. Chem. 2000, 38, (18), 3211-3234.

Hucul, D. A.; Hahn, S. F., "Catalytic Hydrogenation of Polystyrene" Adv Mater (Weinheim, Ger) 2000, 12, (23), 1855-1858.

Kennemur et al., "Synthesis, Thermodynamics, and Dynamics of Poly(4-tertbutylstyrene-b-methyl methacrylate)" Macromolecules, 2012, 45 (17), pp. 7228-7236.

Lee, J. Y.; Shiao, M. C.; Tzeng, F. Y.; Chang, C. H.; Tsai, C. K.; Tsai, J. C.; Lo, K. H.; Lin, S. C.; Ho, R. M., "Syndiotactic Polyallyltrimethylsilane-Based Stereoregular Diblock Copolymers: Syntheses and Self-Assembled Nanostructures" Macromolecules 2012, 45, 2720-2730.

Maheshwari, S.; Tsapatsis, M.; Bates, F. S., "Synthesis and Thermodynamic Properties of Poly(cyclohexylethylene-b-dimethylsiloxane-b-cyclohexylethylene)" Macromolecules 2007, 40, 6638-6646.

Olson, D. A.; Chen, L.; Hillmyer, M. A., "Templating Nanoporous Polymers with Ordered Block Copolymers" Chem. Mater. 2008, 20, 869-890.

Russell, T.P., Hjelm, R.P., Seeger, P.A., "Temperature Dependence of the Interaction Parameter of Polystyrene and Poly(methyl methacrylate)" Macromolecules 1990, 23, 890-893.

Wolf, J. H.; Hillmyer, M. A., "Ordered Nanoporous Poly(cyclohexylethylene)" Langmuir 2003, 19, (16), 6553-6560.

Zalusky, A. S.; Olayo-Valles, R.; Wolf, J. H.; Hillmyer, M. A., "Ordered Nanoporous Polymers from Polystyrene-Polylactide Block Copolymers" J Am Chem Soc 2002, 124, 12761-12773.

Zhao,Y.; Sivaniah, E.; Hashimoto, T., "SAXS Analysis of the Order-Disorder Transition and the Interaction Parameter of Polystyrene-block-poly(methyl methacrylate)" Macromolecules 2008, 41, 9948-9951.

Drockenmuller et al. "Covalent Stabilization of Nanostructures: Robust Block Copolymer Templates from Novel Thermoreactive Systems" Journal of Polymer Science, Part A: Polymer Chemistry (2005) 43(5), pp. 1028-1037.

Rowe-Konopacki et al. "Synthesis of Surface Initiated Diblock Copolymer Brushes from Flat Silicon Substrates Utilizing the RAFT Polymerization Technique" Macromolecules, 2007, 40, 879-888.

Bendejacq et al.; "Well-Ordered Microdomain Structures in Polydisperse Poly(styrene)-Poly(acrylic acid) Diblock Copolymers from Controlled Radical Polymerization"; Macromolecules, vol. 35, 2002, pp. 6645-6649.

Olson et al.; "Templating Nanoporous Polymers with Ordered Block Copolymers"; Chem Matter; 20, 2008, pp. 869-890.

* cited by examiner

POLY(CYCLOHEXYLETHYLENE)-POLYACRYLATE BLOCK COPOLYMERS, METHODS OF MANUFACTURE THEREOF AND ARTICLES COMPRISING THE SAME

BACKGROUND

This disclosure is related to poly(cyclohexylethylene)-polyacrylate block copolymers, methods of manufacture thereof and to articles comprising the same. In particular, this disclosure is related to poly(cyclohexylethylene-polyacrylate block copolymers used for improved nano lithography patterning.

Block copolymers form self-assembled nanostructures in order to reduce the free energy of the system. Nanostructures are those having average largest widths or thicknesses of less than 100 nanometers. This self-assembly produces periodic structures as a result of the reduction in free energy. The periodic structures can be in the form of domains, lamellae or cylinders. Because of these structures, thin films of block copolymers provide spatial chemical contrast at the nanometer-scale and, therefore, they have been used as an alternative low-cost nano-patterning material for generating periodic nanoscale structures. While these block copolymer films can provide contrast at the nanometer scale, it is however often very difficult to produce copolymer films that can display periodicity at less than 20 nanometers. Modern electronic devices often utilize structures that have a periodicity of less than 20 nanometers and it is therefore desirable to produce copolymers that can easily display structures that have average largest widths or thicknesses of less than 20 nanometers, while at the same time displaying a periodicity of less than 20 nanometers.

Many attempts have been made to develop copolymers that have average largest widths or thicknesses of less than 20 nanometers, while at the same time displaying a periodicity of less than 20 nanometers. The following discussion details some of the attempts that have been made to accomplish this.

FIGS. 1A and 1B depict examples of lamella forming block copolymers that are disposed upon a substrate. The block copolymer comprises a block A and a block B that are reactively bonded to each other and that are immiscible with each other. The alignment of lamellae domains can be either parallel (FIG. 1A) or perpendicular (FIG. 1B) to the surface of a substrate surface upon which they are disposed. The perpendicularly oriented lamellae provide nanoscale line patterns, while there is no surface pattern created by parallel oriented lamellae.

Where lamellae form parallel to the plane of the substrate, one lamellar phase forms a first layer at the surface of the substrate (in the x-y plane of the substrate), and another lamellar phase forms an overlying parallel layer on the first layer, so that no lateral patterns of microdomains and no lateral chemical contrast form when viewing the film along the perpendicular (z) axis. When lamellae form perpendicular to the surface, the perpendicularly oriented lamellae provide nanoscale line patterns. Therefore, to form a useful pattern, control of the orientation of the self-assembled microdomains in the block copolymer is desirable.

The block copolymer is annealed with heat (in the presence of an optional solvent), which allows for microphase separation of the polymer blocks A and B at a temperature above the glass transition temperature and below the order to disorder transition temperature. The annealed film can then be further developed by a suitable method such as immersion in a solvent/developer or by reactive ion etching which preferentially removes one polymer block and not the other to reveal a pattern that is commensurate with the positioning of one of the blocks in the copolymer. While this method generates self-assembled films with a uniform spacing, it has not proved useful in continuously and uniformly generating self-assembled films having domain sizes of less than 20 nanometers with a periodicity of less than 20 nanometers.

SUMMARY

Disclosed herein is a block copolymer comprising a first block derived from a cyclo-alkyl vinyl monomer, a hydrogenated vinyl aromatic polymer or a hydrogenated vinyl pyridine polymers; and a second block derived from an acrylate monomer.

Disclosed herein too is a method comprising reacting a first block derived from a cyclo-alkyl vinyl monomer, a hydrogenated vinyl aromatic polymer or a hydrogenated vinyl pyridine polymers with an initiator to form a macro-initiator; and polymerizing a second block onto the first block to form a block copolymer; where the second block is derived by polymerizing an acrylate monomer; and where the block copolymer has a chi parameter of greater than or equal to about 0.05, when measured at a temperature of 200° C. to 210° C.; where the chi parameter is a measure of interactions between the first block and the second block of the copolymer.

Disclosed herein too is a method comprising disposing on a substrate a composition comprising a block copolymer comprising a first block derived from a cyclo-alkyl vinyl monomer, a hydrogenated vinyl aromatic polymer or a hydrogenated vinyl pyridine polymer and a second block derived from an acrylate monomer, where a chi parameter that measures interactions between the first block and the second block is greater than or equal to about 0.5 when measured at a temperature of 200° C. to 210° C.

DETAILED DESCRIPTION

Figure 1:
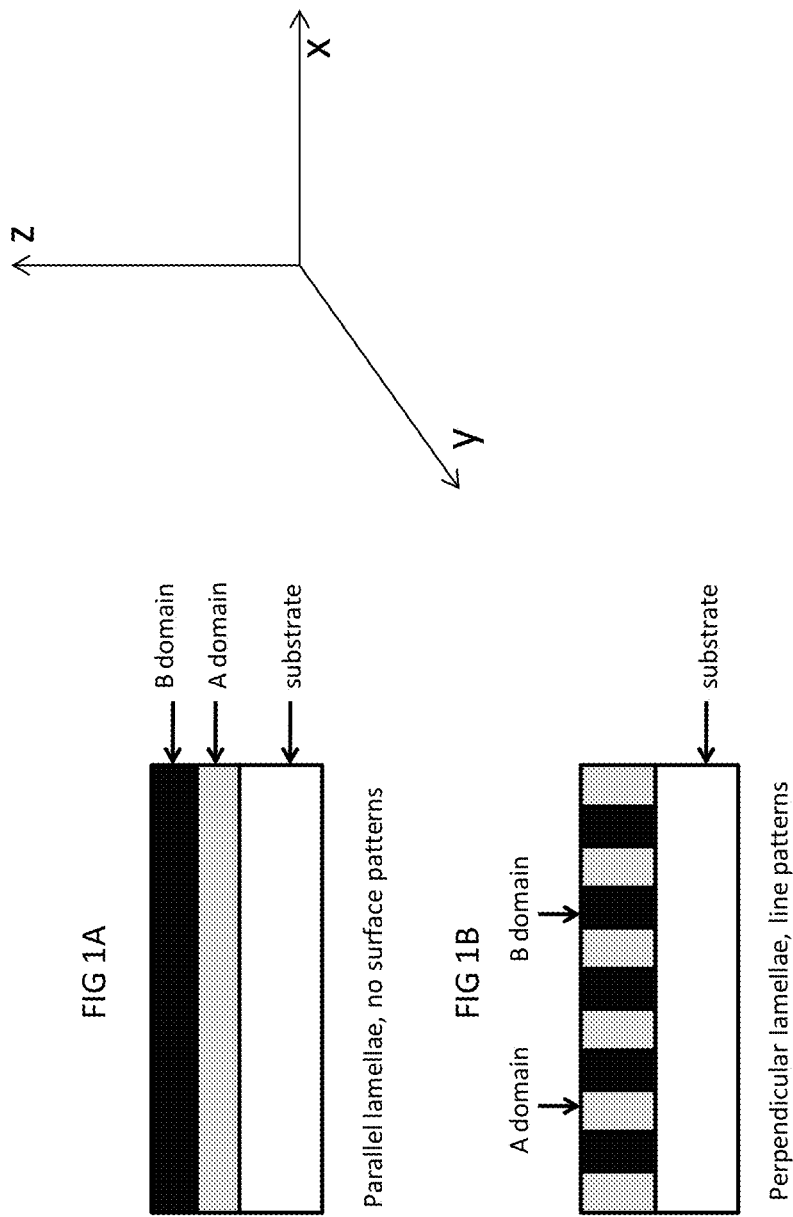
FIGS. 1A and 1B depict examples of lamella forming block copolymers that are disposed upon a substrate.

As used herein, "phase-separated" refers to the propensity of the blocks of block copolymers to form discrete microphase-separated domains, also referred to as "microdomains" or "nanodomains" and also simply as "domains". The blocks of the same monomer aggregate to form periodic domains, and the spacing and morphology of domains depends on the interaction, size, and volume fraction among different blocks in the block copolymer. Domains of block copolymers can form during application, such as during a spin-casting step, during a heating step, or can be tuned by an annealing step. "Heating", also referred to herein as "baking", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for fixing patterns and removing defects in the layer of the block copolymer assembly, and generally involves heating at elevated temperature (e.g., 150° C. to 350° C.), for a prolonged period of time (e.g., several minutes to several days) at or near the end of the film-forming process. Annealing, when performed, is used to reduce or remove defects in the layer (referred to as a "film" hereinafter) of microphase-separated domains.

The self-assembling layer comprising a block copolymer having at least a first block and a second block that forms domains through phase separation that orient perpendicular to the substrate upon annealing. "Domain", as used herein, means a compact crystalline, semi-crystalline, or amorphous region formed by corresponding blocks of the block copolymer, where these regions may be lamellar or cylindrical and are formed orthogonal or perpendicular to the plane of the surface of the substrate and/or to the plane of a surface modification layer disposed on the substrate. In an embodiment, the domains may have an average largest dimension of about 1 to about 25 nanometers (nm), specifically about 5 to about 22 nm, and still more specifically about 5 to about 20 nm.

The term "MN" used herein and in the appended claims in reference to a block copolymer of the present invention is the number average molecular weight of the block copolymer (in g/mol) determined according to the method used herein in the Examples.

The term "MW" used herein and in the appended claims in reference to a block copolymer of the present invention is the weight average molecular weight of the block copolymer (in g/mol) determined according to the method used herein in the Examples.

The term "PDI" or "Đ" used herein and in the appended claims in reference to a block copolymer of the present invention is the polydispersity (also called polydispersity index or simply "dispersity") of the block copolymer determined according to the following equation:

$$PDI = \frac{M_W}{M_N}.$$

As used herein, PCHE-b-PMMA denotes block copolymers of poly(cyclohexylethylene and polymethylmethacrylate.

The transition term "comprising" is inclusive of the transition terms "consisting of" and "consisting essentially of".

The term "and/or" is used herein to mean both "and" as well as "or". For example, "A and/or B" is construed to mean A, B or A and B.

Disclosed herein is a block copolymer comprising a first block polymer (hereinafter "first block" or "first block of the copolymer") and a second block polymer (hereinafter "second block" or "second block of the copolymer") in which the first and second block are chemically dissimilar and are characterized by an energetic penalty of dissolving one block into the other block. This energetic penalty is characterized by the Flory-Huggins interaction parameter or "chi" (denoted by χ) and is an important factor in determining microphase segregation behavior in block copolymers.

Accordingly, the χ value of a block copolymer defines a tendency of the block copolymer to segregate into microdomains as a function of the block copolymer's weight, chain length, and/or degree of polymerization. The chi parameter can often be approximated from the square of the difference in Hildebrand solubility parameters of the respective polymers of the block copolymer. In an exemplary embodiment, the chi parameter has a value of greater than or equal to about 0.05, specifically greater than or equal to about 0.1 at a temperature of 200 to 210° C.

As used herein, the χ parameter denotes the segment-segment interaction parameter associated with a segment volume of 0.118 cubic nanometers (nm3). The molecular weight of a segment, mo, in units of g/mol is equal to the segment volume multiplied by the polymer density and divided by Avogadro's number. Also as used herein, the degree of polymerization, N, is defined as the number of segments per block copolymer molecule and MN=N×mo.

A greater chi parameter between the first block of the copolymer with respect to the second block of the copolymer promotes the formation of smaller, highly periodic lamellar and/or cylindrical domains, which can be used to produce periodic structures in a substrate upon which the copolymer is disposed. In an exemplary embodiment, the periodic structures in the substrate are produced via nanolithography. In one embodiment, the first block of the copolymer is a block derived from the hydrogenation of a vinyl aromatic polymer or form the polymerization of a cyclo-alkyl vinyl monomer while the second block of the copolymer is derived from an ethylenically unsaturated monomer. In one exemplary embodiment, the vinyl aromatic polymer is derived from a vinyl aromatic monomer. The vinyl aromatic monomer is a styrene monomer and/or an alkylstyrene monomer, while the ethylenically unsaturated monomer is an alkyl methacrylate monomer. It is to be noted that the cyclo-alkyl vinyl monomer does not encompass vinyl aromatic monomers. The cyclo-alkyl vinyl monomer is a cyclic aliphatic species and does not contain an aryl ring.

In an exemplary embodiment, the first block of the copolymer is a poly(cyclohexylethylene), which is derived from the hydrogenation of hydroxyl terminated polystyrene or by polymerizing a cyclo-alkyl vinyl monomer, while the second block of the copolymer is polymethylmethacrylate. When the poly(cyclohexylethylene) is obtained by hydrogenating polystyrene, it is first desirable to manufacture the polystyrene. The block of polystyrene is termed an intermediate first block.

In one embodiment, the first block of the copolymer may contain a percentage (about 1 to about 50 mole percent) of polystyrenes other than poly(cyclohexylethylene), while the second block of the copolymer may contain a percentage (about 1 to about 50 mole percent) of polymethacrylates other than polymethylmethacrylate.

The first block of the copolymer and the second block of the copolymer both have a narrow polydispersity index and as a result form block copolymers that display a high degree of periodicity. The copolymers have lamellar and/or cylindrical morphologies and can align perpendicular or parallel to the surface of a substrate upon which they are disposed, thus making them useful for advanced semiconductor patterning. These block copolymers can be used for creating features on a substrate (upon which they are disposed) that are less than or equal to about 25 nanometers. The block copolymer can be further treated via annealing to self-assemble into morphologies that display improved long range order when compared with a comparative copolymer that has the same composition but is not annealed. This feature advantageously permits the block-copolymer to be used as a photoresist with variable interdomain spacings for different lithographic applications.

Disclosed herein too is a method for manufacturing the block copolymer. The method involves using controlled or living polymerization to synthesize the first block of the copolymer and the second block of the copolymer, both of which have a narrow polydispersity index. The block copolymer can be manufactured by a number of different methods listed below.

In one exemplary embodiment, the block copolymer is manufactured using an anionic polymerization technique where the first monomer is first anionically polymerized to form the first block followed by a free-radical polymerization technique to add a second block onto the first block. In one embodiment, the intermediate first block is a polystyrene that is hydroxyl terminated. The hydroxyl terminated polystyrene is termed a first macroinitiator and is hydrogenated to form a hydroxyl terminated poly(cyclohexylethylene). The hydroxyl terminated poly(cyclohexylethylene) is then reacted with an initiator such as α-bromoisobutyryl bromide (BiBB) to form a second macroinitiator for atom transfer radical polymerization (ATRP), reversible addition fragmentation chain transfer polymerization (RAFT), or any other suitable polymerization technique.

The polymerization of the second block is initiated either simultaneously or sequentially with the polymerization (in a separate reactor). The second block is then grown onto the first block copolymer using atom transfer radical polymerization (ATRP), reversible addition fragmentation chain transfer polymerization (RAFT), or any other suitable polymerization technique form the block copolymer having a desired polydispersity index. The second block can also be grown separately from the first block and then the two can be functionalized at the chain ends to enable them to be attached together by a coupling reaction, such as an alkyne-azide "click" reaction.

The block copolymer can be a multiblock copolymer. In one embodiment, the multiblocks can include diblocks, triblock, tetrablocks, and so on. The blocks can be part of a linear copolymer, a branched copolymer where the branches are grafted onto a backbone (these copolymers are also sometimes called "comb copolymers"), a star copolymer, or the like. In an exemplary embodiment, the block copolymer is a linear diblock copolymer.

The first block can be derived from the polymerization of cyclo-alkyl vinyl monomer. In an embodiment, the first block can be derived from a vinylpyridine. The vinylpyridine may be 2-vinylpyridine or 4-vinylpyridine. In another embodiment, the first block of the copolymer is a block derived from a vinyl aromatic monomer. The vinyl aromatic monomer has the structure of the formula (1a):

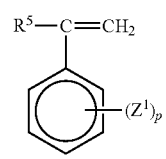

(1a)

wherein $R^5$ is hydrogen, lower alkyl or halogen; $Z^1$ is vinyl, hydroxyl, halogen or lower alkyl; and p is from 0 to about 5. The vinyl aromatic monomers that can be polymerized to produce the first block of the copolymer of the block copolymer are styrenes or alkylstyrenes. Examples of suitable alkylstyrenes are o-methylstyrene, p-methylstyrene, m-methylstyrene, α-methylstyrene, o-ethylstyrene, m-ethylstyrene, p-ethylstyrene, α-methyl-p-methylstyrene, 2,4-dimethylstyrene, monochlorostyrene, p-tert-butylstyrene, 4-tert-butylstyrene, vinyl naphthalene, acenaphthalene, or the like, or a combination comprising at least one of the foregoing alkylstyrene monomers. Other vinyl aromatic monomers such as 4-vinylphenol can also be used to form the first block An exemplary intermediate first block of the copolymer is polystyrene. In one embodiment, the first block of the copolymer may contain about 2 to about 10 weight percent vinyl aromatic species that are not derived from styrene.

When 2-vinylpyridine or 4-vinylpyridine is polymerized, the resulting polymer hydrogenated to form poly(2-vinylpiperidine) or poly(4-vinylpiperidine) respectively.

In one embodiment, the polystyrene, the poly(2-vinylpyridine) or the poly(4-vinylpyridine) is hydroxyl terminated by reacting them with an alkylene oxide. An exemplary alkylene oxide is ethylene oxide. The hydroxyl terminated polystyrene are then hydrogenated to form poly(cyclohexylethylene). The hydroxyl terminated poly(2-vinylpyridine) or the poly(4-vinylpyridine) is converted to poly(2-vinylpiperadine) or the poly(4-vinylpiperadine) respectively.

In an alternative embodiment, the first block comprising poly(cyclohexylethylene) can be obtained by polymerizing vinylcyclohexane using a transition metal initiator, followed by end functionalization with an alkylene oxide. An exemplary alkylene oxide is ethylene oxide.

The number average molecular weight (Mn) of the first block (e.g., the poly(cyclohexylethylene)) is about 1 kg/mol to about 100 kg/mol, specifically about 1.5 kg/mol to about 50 kg/mol and more specifically about 2 kg/mol to about 15 kg/mol grams per mole as measured by multi-angle laser light scattering (MALLS) gel permeation chromatography (GPC) instrument using THF as the mobile phase at a flow of 1 milliliter per minute (mL/min).

The polydispersity index of the first block is less than or equal to about 1.20, specifically less than or equal to about 1.10 and specifically less than or equal to about 1.08 when determined by size exclusion chromatography (SEC) with chloroform as the mobile phase (at 35° C. and a flow rate of 1 mL/min).

The first block comprises about 20 to about 80 volume percent, specifically about 40 to about 60 volume percent, and more specifically about 45 to about 55 volume percent of the total volume of the copolymer. In an exemplary embodiment, the first block comprises about 50 volume percent of the total volume of the copolymer.

The second block of the copolymer is a block derived from an acrylate monomer. In one embodiment, the first repeat unit (i.e., the acrylate monomer) has a structure represented by formula (2):

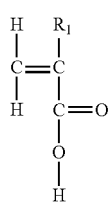

(2)

where $R_1$ is a hydrogen or an alkyl group having 1 to 10 carbon atoms. Examples of the first repeat monomer are acrylates and alkyl acrylates such as α-alkyl acrylates, methacrylates, ethacrylates, propyl acrylates, or the like, or a combination comprising at least one of the foregoing acrylates.

In one embodiment, the first repeat unit has a structure derived from a monomer having a structure represented by the formula (3):

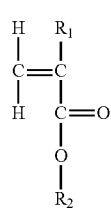

(3)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group. Examples of the alkyl (α-alkyl) acrylates are methacrylate, ethacrylate, propyl acrylate, methyl methacrylate, methyl ethylacrylate, methyl propylacrylate, ethyl ethylacrylate, methyl arylacrylate, or the like, or a combination comprising at least one of the foregoing acrylates. The term "(α-alkyl)acrylate" implies that either an acrylate or (α-alkyl)acrylate is contemplated unless otherwise specified.

As noted above, the second repeat unit is derived from a monomer that has at least one fluorine atom substituent and has a structure represented by the formula (4):

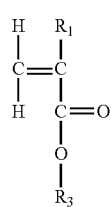

(4)

where $R_1$ is a hydrogen, fluorine, a fluoroalkyl group or an alkyl group having 1 to 10 carbon atoms and $R_3$ is a $C_{2-10}$ fluoroalkyl group. Examples of compounds having the structure of formula (4) are trifluoroethyl methacrylate, and dodecafluoroheptylmethacrylate. An exemplary monomer for the second block of the copolymer is methyl methacrylate. An exemplary second block of the copolymer is polymethylmethacrylate. It is to be noted that the second block of the copolymer may contain about 2 to about 5 weight percent acrylate species that are not derived from methylmethacrylate.

The weight average molecular weight (Mw) of the second block is about 2 kg/mol to about 200 kg/mol, specifically about 5 kg/mol to about 100 kg/mol and more specifically about 7 kg/mol to about 50 kg/mol grams per mole as measured by multi-angle laser light scattering (MALLS) gel permeation chromatography (GPC) instrument using THF as the mobile phase at a flow of 1 milliliter per minute (mL/min). The polydispersity index of the second block is less than or equal to about 1.20, specifically less than or equal to about 1.15 and specifically less than or equal to about 1.10 when determined by size exclusion chromatography (SEC) with chloroform as the mobile phase (at 35° C. and a flow rate of 1 mL/min). The polydispersity index is used to determine the number average molecular weight of the respective blocks or of the entire block copolymer as desired. In order to convert a weight average molecular weight to a number average molecular weight, the weight average molecular weight as measured by gel permeation chromatography (GPC) instrument using THF as the mobile phase at a flow of 1 milliliter per minute (mL/min) is divided by the polydispersity index as determined by size exclusion chromatography (SEC) with chloroform as the mobile phase (at 35° C. and a flow rate of 1 mL/min).

The second block comprises about 20 to about 80 volume percent, specifically about 40 to about 60 volume percent, and more specifically about 45 to about 55 volume percent of the total volume of the copolymer. In an exemplary embodiment, the second block comprises about 50 volume percent of the total volume of the copolymer.

The polydispersity index of the block copolymer is less than or equal to about 1.20, specifically less than or equal to about 1.15 and specifically less than or equal to about 1.10 when determined by size exclusion chromatography (SEC) with chloroform as the mobile phase (at 35° C. and a flow rate of 1 mL/min).

The number average molecular weight of the block copolymer is about 3 to about 150, specifically about 4 to about 100, specifically about 4.5 to about 80, and more specifically about 5 to about 40 kilograms per mole as determined using multi-angle laser light scattering gel permeation chromatography. In an exemplary embodiment, it is desirable for the block copolymer to have a number average molecular weight of about 3 to about 35 kilograms per mole.

The block copolymer has an interdomain spacing as measured by small angle x-ray scattering of less than or equal to about 40 nanometers, specifically less than or equal to about 32 nanometers, more specifically less than or equal to about 25 nanometers, and more specifically less than or equal to about 20 nanometers.

The block copolymer can be manufactured in a batch process or in a continuous process. The batch process or the continuous process can involve a single or multiple reactors, single or multiple solvent and single or multiple catalysts (also termed initiators). In one embodiment, in one method of manufacturing the block copolymer, a first monomer is polymerized anionically to form the first block of the copolymer in a first reactor in the presence of a first solvent and a first initiator. A first endcapping agent is then introduced into the first reactor to quench the anionic reaction in the first reactor and to prevent undesirable side reactions. The second monomer is anionically polymerized into the second block of the copolymer in the presence of a second solvent and a second initiator. The second block may be polymerized in a second reactor. When the second block has reached a desirable molecular weight, the reaction may be quenched using a second endcapping agent. The first block and the second block are then covalently bonded to form the block copolymer. In one embodiment, the first block and the second block are then copolymerized (i.e., chemically (covalently) bonded) to form the block copolymer in the first reactor or the second reactor. The first reactor, the first solvent and the first initiator can be the same or different from the second reactor, the second solvent and the second initiator.

In an exemplary embodiment, the first reactor is the same as the second reactor, the first solvent is the same as the second solvent and the first initiator is the same as the second initiator. In one embodiment, the first monomer is polymerized anionically to form the first block of the copolymer in the first reactor in the presence of the first solvent and the first initiator. In an embodiment, a reactivity accelerating agent may be introduced into the first reactor to increase the rate of the anionic reaction in the first reactor.

The second monomer is then introduced into the first reactor and is anionically polymerized to form the second block that results in the formation of the block copolymer. The anionic polymerization to form the second block is conducted in the presence of the first solvent and the first initiator. In one exemplary embodiment, no additional first initiator is added to the first reactor. This method of copolymerization is termed sequential polymerization. An end capping agent is then introduced into the first reactor to end-cap the copolymer.

Suitable solvents for conducting the reaction are polar solvents, non-polar solvents, or combinations thereof. Examples of solvents are aprotic polar solvents, polar protic solvents, or non polar solvents. In one embodiments, aprotic polar solvents such as propylene carbonate, ethylene carbonate, butyrolactone, acetonitrile, benzonitrile, nitromethane, nitrobenzene, sulfolane, dimethylformamide, N-methylpyrrolidone, or the like, or combinations comprising at least one of the foregoing solvents may be used. In another embodiment, polar protic solvents such as water, methanol, acetonitrile, nitromethane, ethanol, propanol, isopropanol, butanol, or the like, or combinations comprising at least one of the foregoing polar protic solvents may also be used. Other non-polar solvents such a benzene, alkylbenzenes (such as toluene or xylene), methylene chloride, carbon tetrachloride, hexane, diethyl ether, tetrahydrofuran, or the like, or combinations comprising at least one of the foregoing solvents may also be used. Co-solvents comprising at least one aprotic polar solvent and at least one non-polar solvent may also be utilized to modify the swelling power of the solvent and thereby adjust the rate of reaction. In an exemplary embodiment, the first solvent is tetrahydrofuran.

The weight ratio of the solvent to the first monomer (styrene or vinylcyclohexane) is about 5:1 to about 20:1, specifically about 7:1 to about 15:1, and more specifically about 8:1 to about 12:1.

In order to initiate polymerization of the first monomer to form the first block of the copolymer, it is desirable to use a first initiator that can initiate anionic polymerization of a vinyl aromatic compound. The first initiator is an aliphatic hydrocarbon alkali metal compound, an aromatic hydrocarbon alkali metal compound, an organic aminoalkali metal compound, or the like, or a combination comprising at least one of the foregoing first initiators.

Examples of the alkali metals include lithium, sodium, potassium, or the like, or a combination comprising at least one of the foregoing alkali metals. In an exemplary embodiment, the organic alkali metal compounds include an aliphatic and/or aromatic hydrocarbon lithium compound comprising 1 to about 20 carbon atoms, a compound comprising one lithium atom in a single molecule or dilithium, trilithium and tetralithium compounds comprising a plurality of lithium atoms in a single molecule.

In an exemplary embodiment, the first initiator is n-propyllithium, n-butyllithium, sec-butyllithium, tert-butyllithium, hexamethylenedilithium, butadienyldilithium, isoprenyldilithium, a reaction product of diisopropenylbenzene and sec-butyllithium, a reaction product of divinylbenzene, sec-butyllithium and a small amount of 1,3-butadiene, or the like, or a combination comprising at least one of the foregoing first initiators. An exemplary first initiator is sec-butyllithium.

In one embodiment, the first initiator is used in an amount of about 20 to about 2000 moles per mole of the first monomer. In an exemplary embodiment, the first initiator is used in an amount of about 70 to about 300 moles per mole of the first monomer.

The first monomer is reacted to form the first block of the copolymer at a temperature of about −100° C. to about 150° C., specifically about −80° C. to about 100° C. Reaction temperature is selected for the polymerization chemistry in order to minimize side reactions and provide polymer with narrow dispersity. This reaction may be conducted under a vacuum or at an elevated pressure. In one embodiment, the pressure in the reaction vessel is about 0.05 to about 10 kilograms per square centimeter, specifically about 0.07 to about 2 kilograms per square centimeter. The pressure may be applied by using a pressurized inert gas such as nitrogen, argon, carbon dioxide or the like to the reactor.

In order to initiate polymerization of the second monomer to form the block copolymer, it is desirable to add the second monomer to the preformed polymeryl alkali metal compound of the vinyl aromatic compound. In one embodiment, the second monomer is used in an amount of about 20 to about 2000 moles per mole of the initiator. In an exemplary embodiment, the second monomer is used in an amount of about 70 to about 300 moles per mole of the initiator.

In one embodiment, the reaction to form the second block of the copolymer is conducted at a temperature of about −100° C. to about 150° C., specifically about −85° C. to about 100° C. This reaction may be conducted under a vacuum or at an elevated pressure. In one embodiment, the pressure in the reaction vessel is about 0.05 to about 10 kilograms per square centimeter, specifically about 0.07 to about 2 kilograms per square centimeter. The pressure may be applied by using a pressurized inert gas such as nitrogen, argon, carbon dioxide or the like to the reactor. The reaction may also be conducted under a vacuum if desired.

In order to initiate polymerization of the second monomer to form the second block polymer, it is desirable to use a second initiator that can initiate anionic polymerization of a vinyl aromatic compound. The second initiator is optional, i.e., the first initiator may be used to polymerize both the first and the second block of the block copolymer. Examples of suitable initiators are organic alkali metal compounds of alkali metals such as lithium, sodium, potassium, rubidium, cesium, or francium. In one embodiment, the organic alkaline earth metal compounds are organometallic compounds of alkaline earth metals such as beryllium, magnesium, calcium, strontium, barium, or radium.

Examples of the second initiator are n-butyllithium, sec-butyllithium, tert-butyllithium, 1,1-diphenylhexyllithium, diphenylmethyllithium, 1,1-diphenyl-3-methylpentyllithium, fluorenyllithium, triphenylmethyllithium, α-lithiumethyl isobutyrate, oligostyryllithium, polystyryllithium, oligo-α-methylstyryllithium, poly-α-methylstyryllithium, oligobutadienyllithium, polybutadienyllithium, oligoisoprenyllithium, polyisoprenyllithium, and other monovalent organic lithium compounds; diphenylmethylpotassium, triphenylmethylpotassium, diphenylmethylsodium, triphenylmethylsodium, phenylmagnesium bromide, phenylmagnesium chloride, t-butylmagnesium bromide, t-butylmagnesium chloride, or the like, or a combination comprising at least one of the foregoing second initiators. An exemplary second initiator is 1,1-diphenylhexyllithium.

In one embodiment, the second initiator is used in an amount of about 0 to about 2000 moles per mole of the first monomer. In an exemplary embodiment, the second initiator is used in an amount of about 70 to about 300 moles per mole of the first monomer.

In one embodiment, it is it is desirable to quench the reaction when the second block of the copolymer has reached a desired molecular weight. The quenching is accomplished by addition of a protic compound. In a preferred embodiment, the quenching agent is degassed methanol. The quenching agent is added to the reactor in an amount of about 25 to about 1,000,000 moles per mole of the initiator. In an exemplary embodiment, the first endcapping agent is used in an amount of about 500 to about 20,000 moles per mole of the copolymer.

In one embodiment, the respective block polymers may be purified by a variety of methods prior to be reacted to form the block copolymer. Purification of the respective block polymers is optional. In another embodiment, the reactants, the respective block polymers, and the block copolymer may be purified prior to and after the reaction. Purification may include washing, filtration, precipitation, decantation, centrifugation, distillation, or the like, or a combination comprising at least one of the foregoing methods of purification.

In one exemplary embodiment, all reactants including the solvents, initiators and endcapping agents are purified prior to the reaction. It is generally desirable to use reactants, solvents and initiators that are purified to an amount of greater than or equal to about 99 wt % purity, specifically greater than or equal to about 99.5 wt % purity and more specifically greater than about or equal to about 99.9 wt % purity. In another exemplary embodiment, after sequential polymerization of the block copolymer, the block copolymer may be subjected to purification by methods that include washing, filtration, precipitation, decantation, centrifugation or distillation. Purification to remove substantially all metallic impurities and metallic catalyst impurities may also be conducted. The reduction of impurities reduces ordering defects when the block copolymers are annealed.

In one embodiment, the block copolymer can contain anti-oxidants, anti-ozonants, mold release agents, thermal stabilizers, levelers, viscosity modifying agents, free-radical quenching agents, other polymers or copolymers such as impact modifiers, or the like.

The block copolymer after purification may be dissolved in a solvent and then disposed upon the surface of a substrate to form a block copolymer film whose blocks are perpendicular in orientation to the surface of the substrate. In one embodiment, the surface of the substrate may contain a surface modification layer disposed thereon prior to the disposing of the block copolymer onto the surface of the substrate. The surface modification layer can be a block copolymer, a random copolymer, of a blend of homopolymers and form brushes on the surface of the substrate. The substrate can also be patterned such that some areas result in perpendicular orientation while others induce a parallel orientation of the block copolymer domains. The substrate can also be patterned such that some regions selectively interact, or pin, a domain of the block copolymer to induce order and registration of the block copolymer morphology. The substrate can also have topography that induces the alignment and registration of one or more of the domains of the block copolymer. The block copolymer of the invention after being disposed upon the substrate is optionally heated to a temperature of up to 350° C. for up to 4 hours to both remove solvent and form the domains in an annealing process. The annealing of the block copolymer can be used to vary the interdomain spacing (i.e., the periodicity) of the cylindrical and/or lamellar domains. The size of the domains can also be varied by annealing.

The domains of the block copolymer form perpendicular to the substrate and the first block aligns to the pattern created on the first domain to the "pinning" feature on the substrate, and the second block forms a second domain on the substrate aligned adjacent to the first domain. Where the patterned substrate forms a sparse pattern, and hence the surface modification layer regions are spaced at an interval greater than an interval spacing of the first and second domains, additional first and second domains form on the surface modification layer to fill the interval spacing of the sparse pattern. The additional first domains, without a pinning region to align to, instead align perpendicular to the previously formed perpendicular orientation inducing surface modification layer, and additional second domains align to the additional first domains.

One of the domains of the block copolymer (formed from either the first block of the copolymer or the second block of the copolymer) may then be preferentially etched away. A relief pattern is then formed by removing either the first or second domain to expose an underlying portion of the surface modification layer. In an embodiment, removing is accomplished by a wet etch method, developing, or a dry etch method using a plasma such as an oxygen plasma. The block copolymer with at least one domain removed is then used as a template to decorate or manufacture other surfaces that may be used in fields such as electronics, semiconductors, and the like.

The invention is further illustrated by the following non-limiting examples.

EXAMPLES

This example was conducted to demonstrate a method of manufacturing the block copolymer. A series of symmetric poly(cyclohexylethylene)-block-poly(methyl methacrylate) (PCHE-b-PMMA) diblock copolymers with varying molar mass and narrow molar mass distribution were prepared using sequential anionic polymerization. In the manufacturing of the block copolymer, polystyrene was first synthesized from a vinyl aromatic monomer (styrene). The polystyrene was then endcapped with ethylene oxide to produce hydroxyl terminated polystyrene. The hydroxyl terminated polystyrene was then hydrogenated to form poly(cyclohexylethylene). The poly(cyclohexylethylene) is then converted to macroinitiator to so that it can be copolymerized with polymethylmethacrylate using atom transfer radical polymerization. The poly(cyclohexylethylene) is then chain extended with the polymethylmethacrylate to form poly (cyclohexylethylene)-block-polymethylmethacrylate. The block copolymer with the macroinitiator is then purified to remove the macroinitiator and form the block copolymer.

Reagents. Styrene (>99% stabilized), methyl methacrylate (MMA) (>98.5%), ethylene oxide (EtO) (≥99.5%), α-bromoisobutyryl bromide (BiBB) (98%), anhydrous methanol, sec-butyllithium (s-BuLi) (1.4 M in hexanes), dibutyl magnesium (DBMg) (1 M in heptane), n-butyllithium (n-BuLi) (2.5 M in hexanes), trioctylaluminum (TOA) (25 wt % in hexanes), anisole (anhydrous, 99.7%), triethylamine (≥99%), N,N,N',N'',N''-pentamethyldiethylenetriamine (PMDETA) (99%), copper(I) chloride (CuCl), and calcium hydride ($CaH_2$) powder were purchased from Sigma-Aldrich. The Dow Hydrogenation Catalyst (DHC), 5% platinum supported on wide-pore silica, was supplied by the Dow Chemical Company (Hucul, D. A.; Hahn, S. F. Adv Mater (Weinheim, Ger) 2000, 12, (23), 1855-1858.). Deuterated chloroform ($CDCl_3$) was purchased from Cambridge Isotope Labs. Tetrahydrofuran (THF) and cyclohexane were passed through a home-built solvent purification system, which includes a column of activated alumina and a column of molecular sieves operated under a positive pressure of nitrogen gas.

Reagent Purification. The reagents, temperatures, and vacuum transfer techniques used for the anionic purification of styrene (exposure to CaH2 then DBMg), and cyclohexane (taken from solvent system followed by distillation from n-BuLi) follow previously published procedures (Hadjichristidis, N.; Iatrou, H.; Pispas, S.; Pitsikalis, M. J. Polym. Sci. Part A: Polym. Chem. 2000, 38, (18), 3211-3234). Ethylene oxide (EtO), employed to end-functionalize the PS chains, was condensed into a flask containing CaH2 at −78° C. The flask was then warmed to 0° C. and stirred for 30 minutes (min). After a complete freeze-pump-thaw cycle, the EtO was transferred to a clean dry buret and stored at 0° C. Anisole, MMA, and PMDETA were passed through a plug of basic alumina prior to use. CuCl was recrystallized from glacial acetic acid, washed with ethanol, dried, and stored under nitrogen atmosphere. All other reagents and solvents were used as received unless otherwise noted.

Characterization. Dispersities (Đ) (i.e., the polydispersity index) were determined by size exclusion chromatography (SEC) using HP 1100 series components, three successive Varian PLgel Mixed-C columns with chloroform as the mobile phase (at 35° C. and a flow rate of 1 mL/min) and eluents monitored using an HP 1047A RI detector. Đ values were determined based on a ten-point calibration curve using polystyrene standards purchased from Polymer Laboratories. Weight average molecular weights (Mw) were determined using a separate SEC instrument using THF as the mobile phase at a flow of 1 mL/min. The SEC is equipped with a Wyatt Technology DAWN DSP multi-angle laser light scattering (MALLS) detector in addition to a Wyatt Optilab EX RI detector. Size exclusion was performed with three successive Phenomenex Phenogel-5 columns and Mw values are determined from the dn/dc value of PS (0.185 mL/g) homopolymer reported in literature. The volume fractions (f) of each block were calculated from the molar block fractions determined by $^1$H-NMR in $CDCl_3$ on a Varian Inova 500 MHz spectrometer using an 8 sec relaxation time. Chemical shifts were referenced from tetramethylsilane at 0.00 ppm. Molar fractions were obtained from integration comparison of the PCHE aliphatic protons versus the PMMA methoxy protons. Glass transition temperatures (Tg) were determined using differential scanning calorimetry (DSC) on a TA Instruments Discovery DSC using T-zero aluminum pans. Thermogravimetric analysis (TGA) was performed on a Perkin Elmer Diamond TGA/DTA under nitrogen atmosphere.

Example 1. Synthesis of Hydroxyl Terminated Polystyrene PS-OH-1

The procedure for anionic synthesis of PS, followed by capping of the chain with EtO to provide a primary alcohol end group, has been described in detail previously (Zalusky, A. S.; Olayo-Valles, R.; Wolf, J. H.; Hillmyer, M. A. J Am Chem Soc 2002, 124, 12761-12773; Wolf, J. H.; Hillmyer, M. A. Langmuir 2003, 19, (16), 6553-6560). Using sec-BuLi as the initiator, styrene polymerization was performed in cyclohexane at 40° C. for 4-5 hours. EtO was then administered by warming small doses from an externally chilled buret connected to the reactor with Ultra-Torr (Swagelok) tubing. This resulted in an increase of vessel pressure of 2-3 psi. The EtO gas is gradually absorbed by the reaction solution and end-functionalization could be visualized by the loss of dark orange styrenyl anions and progression of the reaction to a colorless solution. To ensure complete functionalization, the reaction was allowed to stir overnight under positive pressure of both argon and EtO (5 psi total, ~3 psi EtO). Isopropanol (1-2 mL), slightly acidified with H2SO4, was then added to the reaction prior to polymer precipitation in isopropanol. The collected polymer was re-dissolved in THF and precipitated in methanol followed by complete drying of the solids in a vacuum oven at 60° C. overnight. The isolated polymer had Mw=10.5 kg/mol and Đ=1.01 as determined by MALLS-SEC and 95% hydroxyl group functionalization obtained by 1H-NMR.

Example 2. Synthesis of Hydroxyl Terminated Polystyrene PS-OH-2

The above procedure from Example 1 was modified to give a PS-OH material with Mw=7.9 kg/mol and Đ=1.13 as determined by MALLS-SEC and >99% hydroxyl group functionalization obtained by $^1$H-NMR.

Example 3. Synthesis of Hydroxyl Terminated Polystyrene PS-OH-3

The above procedure from Example 1 was modified to give a PS-OH material with Mw=4.0 kg/mol and Đ=1.04 as determined by MALLS-SEC and >99% hydroxyl group functionalization obtained by $^1$H-NMR.

Example 4. Synthesis of Hydroxyl Terminated Polystyrene PS-OH-4

The above procedure from Example 1 was modified to give a PS-OH material with Mw=2.3 kg/mol and Đ=1.02 as determined by MALLS-SEC and 98% hydroxyl group functionalization obtained by $^1$H-NMR. The data from the Examples 1-4 are shown in the Table 1 below.

TABLE 1

Characterization Results for Examples 1-4, PS—OH Samples.

| Example | Polymer ID | $M_w$ (kg/mol)[a] | $M_n$ (kg/mol)[b] | DP[c] | N[d] | % F[e] | $Đ_{obs}$[f] | $Đ_{calc}$[g] | $T_g$ (° C.)[h] |
|---|---|---|---|---|---|---|---|---|---|
| Example 1 | PS—OH-1 | 10.5 | 10.9 | 105 | 160 | 95 | 1.01 | (0.96) | 97 |
| Example 2 | PS—OH-2 | 7.9 | 6.7 | 63 | 97 | >99 | 1.13 | 1.18 | 93 |

TABLE 1-continued

Characterization Results for Examples 1-4, PS—OH Samples.

| Example | Polymer ID | $M_w$ (kg/mol)[a] | $M_n$ (kg/mol)[b] | $DP$[c] | $N$[d] | % F[e] | $Đ_{obs}$[f] | $Đ_{calc}$[g] | $T_g$ (° C.)[h] |
|---|---|---|---|---|---|---|---|---|---|
| Example 3 | PS—OH-3 | 4.0 | 3.9 | 37 | 57 | >99 | 1.04 | 1.03 | 84 |
| Example 4 | PS—OH-4 | 2.3 | 2.2 | 20 | 32 | 98 | 1.02 | 1.05 | 68 |

[a]Weight average molar mass from MALLS-SEC using literature dn/dc value of 0.185 mL/g for PS in THF at 25° C.
[b]Number average molar mass determined from chemical degree of polymerization followed by addition of end groups (s-butyl = 57 g/mol, EtO = 45 g/mol).
[c]Chemical degree of polymerization determined by $^1$H-NMR.
[d]Degree of polymerization corrected within lattice theory using a 118 Å$^3$ reference volume ($v_0$) and the density of PS at 140° C. ($\rho$ = 0.97 g/cm$^3$).
[e]Percentage of hydroxyl group functionalization obtained by $^1$H-NMR.
[f]Observed dispersity (Đ) from MALLS-SEC.
[g]Calculated dispersity ($M_w/M_n$) using MALLS-SEC determined $M_w$ and $^1$H-NMR determined $M_n$.
[h]Midpoint temperature of the glass transition observed by DSC at 10° C./min.

Example 5. Synthesis of Poly(Cyclohexylethylene) PCHE-OH-1

For hydrogenation of PS-OH-1, 0.7-0.8 g of catalyst was added to a 200 mL Parr reactor with jacketed temperature control and mechanical stirring. The reactor was sealed and checked for leaks by administering static argon pressure. A vacuum pump was attached and the catalyst was held under vacuum at 100° C. for an hour. The reactor was then cooled and backfilled with argon. Separately, 7-8 g of PS-OH-1 (10:1 polymer:catalyst ratio by weight) was dissolved in 130 mL of anhydrous cyclohexane. The solution was transferred into a solution delivery vessel (SDV) and purged with argon for 15 minutes prior to attachment to the reactor. Once attached, 50 psi argon was applied to the SDV and used to displace the contents into the reactor. Following depressurization, the SDV was detached, stirring was initiated, and partial pressurization with H2 (~300 psi) was applied. The vessel was heated and stabilized at 120° C., during this time the pressure in the vessel increased with temperature but began to slowly decrease at higher temperature as the reaction started. Once temperature had stabilized at 120° C., the vessel was fully pressurized to 500 psi H2. The pressure in the vessel was replenished periodically as the hydrogenation progressed. Once most of the hydrogenation was complete, the pressure remained static within the vessel. The solution was allowed to stir at 120±5° C. for ~48 hours. Following cooling, depressurization, and removal of the crude reaction product, the catalyst was removed by filtration through a Millipore filter flask containing a 0.45 μm HVHP membrane. The cyclohexane was removed by rotary evaporation followed by dissolution of the white solids in THF, precipitated in methanol, collected, and dried at 60° C. overnight under vacuum. The isolated polymer had Mw=11.7 kg/mol and Đ=1.09 as determined by MALLS-SEC and >99% hydrogenation and 96% hydroxyl group functionalization obtained by $^1$H-NMR.

Example 6. Synthesis of Poly(Cyclohexylethylene) PCHE-OH-2

The above procedure from Example 5 was modified to give a PCHE-OH material with Mw=6.9 kg/mol and Đ=1.19 as determined by MALLS-SEC and >99% hydrogenation and 98% hydroxyl group functionalization obtained by $^1$H-NMR.

Example 7. Synthesis of Poly(Cyclohexylethylene) PCHE-OH-3

The above procedure from Example 5 was modified to give a PCHE-OH material with Mw=4.2 kg/mol and Đ=1.01 as determined by MALLS-SEC and >99% hydrogenation and 97% hydroxyl group functionalization obtained by $^1$H-NMR.

Example 8. Synthesis of Poly(Cyclohexylethylene) PCHE-OH-4

The above procedure from Example 5 was modified to give a PCHE-OH material with Mw=2.3 kg/mol and Đ=1.02 as determined by MALLS-SEC and >99% hydrogenation and 95% hydroxyl group functionalization obtained by $^1$H-NMR. The data for PCHE-OH-1, PCHE-OH-2, PCHE-OH-3 and PCHE-OH-4 are shown in the Table 2 below.

TABLE 2

Characterization Results for poly(cyclohexylethylene) PCHE—OH Samples.

| Example | Polymer ID | % $H_2$[a] | $M_n$ (kg/mol)[b] | Đ[c] | $N$[d] | % F[e] | $T_g$ (° C.)[f] |
|---|---|---|---|---|---|---|---|
| Example 5 | PCHE—OH-1 | >99 | 11.7 | 1.02 | 177 | 96 | 136 |
| Example 6 | PCHE—OH-2 | >99 | 6.9 | 1.19 | 105 | 98 | 126 |
| Example 7 | PCHE—OH-3 | >99 | 4.2 | 1.01 | 62 | 97 | 118 |
| Example 8 | PCHE—OH-4 | >99 | 2.3 | 1.02 | 34 | 95 | 97 |

[a]Percentage of polymer hydrogenated determined from remaining aryl and olefinic hydrogens observed by $^1$H-NMR.
[b]Based on 100% hydrogenation of the PS—OH precursor.
[c]Dispersity from SEC in THF at 25° C.
[d]Degree of polymerization corrected based on 118 Å$^3$ reference volume ($v_0$) and the density of PCHE at 140° C. ($\rho$ = 0.92 g/cm$^3$).
[e]Percentage of hydroxyl functionality retained after hydrogenation.
[f]Midpoint temperature of the glass transition observed by DSC at 10° C./min.

Example 9. Synthesis of PCHE-BiBB-1

The procedure for functionalization of PCHE-OH-1 with α-bromoisobutyryl bromide (BiBB) and triethylamine (TEA) as an acid scavenger was derived from a similar reaction published by Lee et al (Lee, J. Y.; Shiao, M. C.; Tzeng, F. Y.; Chang, C. H.; Tsai, C. K.; Tsai, J. C.; Lo, K. H.; Lin, S. C.; Ho, R. M. Macromolecules 2012, 45, 2720-2730). α-bromoisobutyryl bromide (BiBB) is used to convert the hydroxyl terminated poly(cyclohexylethylene) to a macroinitiator. TEA-HBr salts were removed from the PCHE-BiBB product by successive dissolution in THF and precipitation in MeOH until unseen by 1H-NMR. $^1$H NMR spectroscopy revealed quantitative BiBB functionalization.

Example 10. Synthesis of PCHE-BiBB-2

The above procedure from Example 9 was used to convert PCHE-OH-2 to a PCHE-BiBB material with quantitative BiBB functionalization by 1H-NMR.

Example 1. Synthesis of PCHE-BiBB-3

The above procedure from Example was used to convert PCHE-OH-3 to a PCHE-BiBB material with quantitative BiBB functionalization by $^1$H-NMR.

Example 12. Synthesis of PCHE-BiBB-4

The above procedure from Example 9 was used to convert PCHE-OH-4 to a PCHE-BiBB material with quantitative BiBB functionalization by 1H-NMR.

Example 13. Synthesis of PCHE-PMMA

Atom transfer radical polymerization (ATRP) of MMA using PCHE-BiBB macroinitiator was used to synthesize PCHE-PMMA block copolymers. A master catalyst solution was created with known concentrations of CuBr (0.08 mmol) and PMDETA ligand (0.16 mmol) in toluene. The mixture was freeze-pump-thawed (FPT) scrupulously followed by backfilling with dry argon. Gentle heating and stirring was applied to complex and homogeneously dissolve the catalyst to an emerald green solution. In a 75 mL pressure vessel fitted with a side arm and teflon stopcock, a known mass of PCHE-BiBB-1 (0.08 mmol) was dissolved in a specific volume of toluene to bring the total toluene volume to 50 mL. MMA (22 mmol) was then added to the macroinitiator solution followed by three FPT cycles and backfilling the solution with dry argon.

Under a continuous blanket of dry argon flow, the appropriate amount of catalyst solution is transferred into the reaction solution using a volumetric syringe. The pressure vessel is then FPT one final time, backfilled with ~1 PSI argon, sealed, and placed in an oil bath at 80° C. with stirring. MMA conversion checks were performed at known reaction times by quickly cooling the reaction solution to 0° C. and removing a small aliquot under a continuous argon blanket. The reaction was then resealed and returned to 80° C. to restart the MMA propagation. After 21 hours (h), the reaction had reached 43% MMA conversion, and the polymer was isolated by precipitation into copious methanol, filtration, and drying to constant mass en vacuo. GPC analysis revealed the desired product PCHE-PMMA along with unreacted PMMA-BiBB.

Example 14. Purification of PCHE-PMMA-1

The polymer from Example was purified by Soxhlet extraction of unreacted PCHE-BiBB macroinitiator with hexanes followed by drying to constant mass en vacuo. GPC analysis revealed the desired product PCHE-PMMA-1 without the contaminant—unreacted PMMA-BiBB.

Example 15. Synthesis of PCHE-PMMA-2

Atom transfer radical polymerization (ATRP) of MMA using PCHE-BiBB macroinitiator was used to synthesize PCHE-PMMA block copolymers. A master catalyst solution was created with known concentrations of CuCl (0.21 mmol) and PMDETA ligand (0.42 mmol) in toluene. The mixture was freeze-pump-thawed (FPT) scrupulously followed by backfilling with dry argon. Gentle heating and stirring was applied to complex and homogeneously dissolve the catalyst to an emerald green solution. In a 75 mL pressure vessel fitted with a side arm and teflon stopcock, a known mass of PCHE-BiBB-2 (0.14 mmol) was dissolved in a specific volume of toluene to bring the total toluene volume to 25 mL. MMA (24 mmol) was then added to the macroinitiator solution followed by three FPT cycles and backfilling the solution with dry argon. Under continuous blanket of dry argon flow, the appropriate amount of catalyst solution is transferred into the reaction solution using a volumetric syringe. The pressure vessel is then FPT one final time, backfilled with ~1 PSI argon, sealed, and placed in an oil bath at 80° C. with stirring. MMA conversion checks were performed at known reaction times by quickly cooling the reaction solution to 0° C. and removing a small aliquot under a continuous argon blanket. The reaction was then resealed and returned to 80° C. to restart the MMA propagation. After 6 hours the reaction had reached 49% MMA conversion, and the polymer was isolated by precipitation into methanol. Unreacted PMMA-BiBB was removed by Soxhlet extraction with hexanes, and the resulting PCHE-PMMA was isolated by drying to constant mass en vacuo. Analytical details of the isolated polymer are collected and detailed in the Table 3 below.

Example 16. Synthesis of PCHE-PMMA-3

Figure 2:
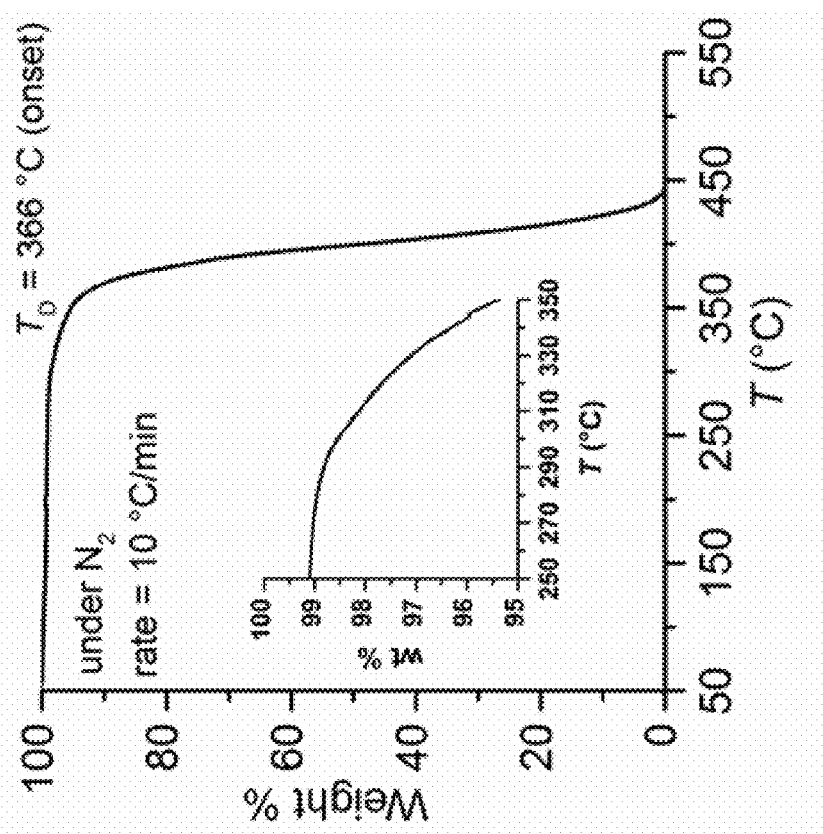
FIG. 2 is a graph depicting thermal decomposition data obtained using thermogravimetric analysis (TGA) for the block copolymer PCHE-PMMA-3 of Example 16.

Atom transfer radical polymerization (ATRP) of MMA using PCHE-BiBB macroinitiator was used to synthesize PCHE-PMMA block copolymers. A master catalyst solution was created with known concentrations of CuCl (0.14 mmol) and PMDETA ligand (0.28 mmol) in anisole. The mixture was freeze-pump-thawed (FPT) scrupulously followed by backfilling with dry argon. Gentle heating and stirring was applied to complex and homogeneously dissolve the catalyst to an emerald green solution. In a 75 mL pressure vessel fitted with a side arm and teflon stopcock, a known mass of PCHE-BiBB-2 (0.14 mmol) was dissolved in a specific volume of anisole to bring the total anisole volume to 15 mL. MMA (12 mmol) was then added to the macroinitiator solution followed by three FPT cycles and backfilling the solution with dry argon. Under continuous blanket of dry argon flow, the appropriate amount of catalyst solution is transferred into the reaction solution using a volumetric syringe. The pressure vessel is then FPT one final time, backfilled with ~1 PSI argon, sealed, and placed in an oil bath at 80° C. with stirring. MMA conversion checks were performed at known reaction times by quickly cooling the reaction solution to 0° C. and removing a small aliquot under a continuous argon blanket. The reaction was then resealed and returned to 80° C. to restart the MMA propagation. After 2.3 hours the reaction had reached 54% MMA conversion, and the polymer was isolated by precipitation into methanol. Unreacted PMMA-BiBB was removed by Soxhlet extraction with hexanes, and the resulting PCHE-PMMA was isolated by drying to constant mass en vacuo. Analytical details of the isolated polymer are collected in Table 3 below. TGA analysis of PCHE-PMMA-3 performed under inert nitrogen atmosphere at a heating rate of 10° C./min shows an onset decomposition temperature, TD=366° C., and less than 5% weight loss up to 350° C. The FIG. 2 depicts a degradation graph for the block copolymer PCHE-PMMA-3, performed under inert nitrogen atmosphere at a heating rate of 10° C./min. It shows an onset decomposition temperature, TD=366° C. and less than 5% weight loss up to 350° C.

Example 17. Synthesis of PCHE-PMMA-4

Atom transfer radical polymerization (ATRP) of MMA using PCHE-BiBB macroinitiator was used to synthesize PCHE-PMMA block copolymers. A master catalyst solution was created with known concentrations of CuCl with 15 mol % $CuCl_2$ (0.23 mmol) and PMDETA ligand (0.46 mmol) in anisole. The mixture was freeze-pump-thawed (FPT) scrupulously followed by backfilling with dry argon. Gentle heating and stirring was applied to complex and homogeneously dissolve the catalyst to an emerald green solution. In a 75 mL pressure vessel fitted with a side arm and teflon stopcock, a known mass of PCHE-BiBB-3 (0.23 mmol) was dissolved in a specific volume of anisole to bring the total anisole volume to 15 mL. MMA (23 mmol) was then added to the macroinitiator solution followed by three FPT cycles and backfilling the solution with dry argon. Under continuous blanket of dry argon flow, the appropriate amount of catalyst solution is transferred into the reaction solution using a volumetric syringe. The pressure vessel is then FPT one final time, backfilled with ~1 PSI argon, sealed, and placed in an oil bath at 80° C. with stirring. MMA conversion checks were performed at known reaction times by quickly cooling the reaction solution to 0° C. and removing a small aliquot under a continuous argon blanket. The reaction was then resealed and returned to 80° C. to restart the MMA propagation. After 1.7 hours the reaction had reached 54% MMA conversion, and the polymer was isolated by precipitation into methanol. Unreacted PMMA-BiBB was removed by Soxhlet extraction with hexanes, and the resulting PCHE-PMMA was isolated by drying to constant mass en vacuo. Analytical details of the isolated polymer are collected in Table 3 below.

Example 18. Synthesis of PCHE-PMMA-5

Atom transfer radical polymerization (ATRP) of MMA using PCHE-BiBB macroinitiator was used to synthesize PCHE-PMMA block copolymers. A master catalyst solution was created with known concentrations of CuCl with 15 mol % $CuCl_2$ (0.27 mmol) and PMDETA ligand (0.54 mmol) in anisole. The mixture was freeze-pump-thawed (FPT) scrupulously followed by backfilling with dry argon. Gentle heating and stirring was applied to complex and homogeneously dissolve the catalyst to an emerald green solution. In a 75 mL pressure vessel fitted with a side arm and teflon stopcock, a known mass of PCHE-BiBB-3 (0.27 mmol) was dissolved in a specific volume of anisole to bring the total anisole volume to 30 mL. MMA (27 mmol) was then added to the macroinitiator solution followed by three FPT cycles and backfilling the solution with dry argon. Under continuous blanket of dry argon flow, the appropriate amount of catalyst solution is transferred into the reaction solution using a volumetric syringe. The pressure vessel is then FPT one final time, backfilled with ~1 PSI argon, sealed, and placed in an oil bath at 80° C. with stirring. MMA conversion checks were performed at known reaction times by quickly cooling the reaction solution to 0° C. and removing a small aliquot under a continuous argon blanket. The reaction was then resealed and returned to 80° C. to restart the MMA propagation. After 3 hours, the reaction had reached 40% MMA conversion, and the polymer was isolated by precipitation into methanol. Unreacted PMMA-BiBB was removed by Soxhlet extraction with hexanes, and the resulting PCHE-PMMA was isolated by drying to constant mass en vacuo. Analytical details of the isolated polymer are collected in Table 3.

Example 19. Synthesis of PCHE-PMMA-6

Atom transfer radical polymerization (ATRP) of MMA using PCHE-BiBB macroinitiator was used to synthesize PCHE-PMMA block copolymers. A master catalyst solution was created with known concentrations of CuCl (0.41 mmol) and PMDETA ligand (0.82 mmol) in a toluene/anisole mixture (50% v/v). The mixture was freeze-pump-thawed (FPT) scrupulously followed by backfilling with dry argon. Gentle heating and stirring was applied to complex and homogeneously dissolve the catalyst to an emerald green solution. In a 75 mL pressure vessel fitted with a side arm and teflon stopcock, a known mass of PCHE-BiBB-4 (0.41 mmol) was dissolved in a specific volume of toluene/anisole to bring the total toluene/anisole volume to 11 mL. MMA (25 mmol) was then added to the macroinitiator solution followed by three FPT cycles and backfilling the solution with dry argon. Under continuous blanket of dry argon flow, the appropriate amount of catalyst solution is transferred into the reaction solution using a volumetric syringe. The pressure vessel is then FPT one final time, backfilled with ~1 PSI argon, sealed, and placed in an oil bath at 80° C. with stirring. MMA conversion checks were performed at known reaction times by quickly cooling the reaction solution to 0° C. and removing a small aliquot under a continuous argon blanket. The reaction was then resealed and returned to 80° C. to restart the MMA propagation. After 0.5 hours, the reaction had reached 59% MMA conversion, and the polymer was isolated by precipitation into methanol. Unreacted PMMA-BiBB was removed by Soxhlet extraction with hexanes, and the resulting PCHE-PMMA was isolated by drying to constant mass en vacuo. Analytical details of the isolated polymer are collected in Table 3 below.

Example 20. Synthesis of PCHE-PMMA-7

Atom transfer radical polymerization (ATRP) of MMA using PCHE-BiBB macroinitiator was used to synthesize PCHE-PMMA block copolymers. A master catalyst solution was created with known concentrations of CuCl (0.39 mmol) and PMDETA ligand (0.78 mmol) in a toluene/anisole mixture (50% v/v). The mixture was freeze-pump-thawed (FPT) scrupulously followed by backfilling with dry argon. Gentle heating and stirring was applied to complex and homogeneously dissolve the catalyst to an emerald green solution. In a 75 mL pressure vessel fitted with a side arm and teflon stopcock, a known mass of PCHE-BiBB-4 (0.39 mmol) was dissolved in a specific volume of toluene/anisole to bring the total toluene/anisole volume to 21 mL. MMA (16 mmol) was then added to the macroinitiator solution followed by three FPT cycles and backfilling the solution with dry argon. Under continuous blanket of dry argon flow, the appropriate amount of catalyst solution is transferred into the reaction solution using a volumetric syringe. The pressure vessel is then FPT one final time, backfilled with ~1 PSI argon, sealed, and placed in an oil bath at 80° C. with stirring. MMA conversion checks were performed at known reaction times by quickly cooling the reaction solution to 0° C. and removing a small aliquot under a continuous argon blanket. The reaction was then resealed and returned to 80° C. to restart the MMA propagation. After 2.2 hours, the reaction had reached 52% MMA conversion, and the polymer was isolated by precipitation into methanol. Unreacted PMMA-BiBB was removed by Soxhlet extraction with hexanes, and the resulting PCHE-PMMA was isolated by drying to constant mass en vacuo. Analytical details of the isolated polymer are collected in Table 3 below.

TABLE 3

Characterization Results for PCHE—PMMA Block Copolymer Samples.

| Example | Polymer ID | $M_n$ (kg/mol)[a] | Đ[a] | $f_{PCHE}$[b] | N[d] | $T_g$ (° C.)[d] | $T_{ODT}$ (° C.)[e] | D (nm)[f] |
|---|---|---|---|---|---|---|---|---|
| Example 14 | PCHE—PMMA-1 | 30.6 | 1.15 | 0.43 | 412 | 134 | | 32.6 |
| Example 15 | PCHE—PMMA-2 | 19.4 | 1.30 | 0.41 | 259 | 124 | | 24.2 |
| Example 16 | PCHE—PMMA-3 | 14.8 | 1.14 | 0.52 | 202 | 123 | | 19.9 |
| Example 17 | PCHE—PMMA-4 | 10.3 | 1.10 | 0.45 | 137 | 120 | 332 | 14.8 |
| Example 18 | PCHE—PMMA-5 | 9.5 | 1.11 | 0.48 | 128 | 118 | 325 | 14.6 |
| Example 19 | PCHE—PMMA-6 | 7.0 | 1.07 | 0.38 | 90 | 111 | | 12.2 |
| Example 10 | PCHE—PMMA-7 | 5.8 | 1.12 | 0.45 | 76 | 109 | 204 | 10.4 |

[a]$M_n$ and dispersity from SEC in THF at 25° C.
[b]PCHE volume fraction determined using 140° C. densities ρ(PCHE) = 0.92 g/cm³ and ρ(PMMA) = 1.13 g/cm³.
[c]Number of statistical segments, N, based on 118 Å³ reference volume ($v_0$).
[d]Glass transition temperature midpoint values.
[e]Determined using dynamic mechanical analysis by a delineation of the G' modulus with respect to temperature according to the method described in Example .
[f]Determined by 25° C. SAXS analysis of the principle lamellar scattering peak q*, where D = 2π/q*.

Example 21. Determination of the Order-Disorder Transition Temperature and the Temperature-Dependent Flory-Huggins Interaction Parameter Dynamic mechanical analysis was performed to determine the order-to-disorder transition temperature (ODT) of several of the PCHE-PMMA block copolymers. Dynamic Mechanical Spectroscopy (DMS) experiments were conducted on a TA Instruments ARES Rheometer with 25 mm parallel plates, nitrogen purged sample chamber, and a thermocouple located directly below the bottom plate. ODT values were identified by a delineation of the G' modulus with respect to temperature and are collected in Table. DMS plots of the elastic modulus, G'(Pa), upon heating for: (a) Example, PCHE-PMMA-7, N=76, ω=1 rad/s, strain=3%, rate=1° C./min; (b) Example, PCHE-PMMA-5, N=128, ω=100 rad/s, strain=10%, rate=10° C./min; and (c) Example, PCHE-PMMA-4, N=137, ω=100 rad/s, strain=10%, rate=10° C./min. The order-disorder transitions are observed by a drop in G' at 204, 325, and 332° C., respectively. Using self-consistent mean field theory, the product of χ(N) is equal to 10.5 for a 50/50 block fraction at the ODT, where N is equal to the degree of polymerization of the polymer. For the BCPs analyzed above, χ was determined as 0.138, 0.0820, and 0.0766, respectively. This value is a factor of 5 higher than that of PS-PMMA at the same condition (χPS-PMMA=0.029 at 204° C., from Zhao, Y.; Sivaniah, E.; Hashimoto, T. Macromolecules 2008, 41, 9948-9951). From these data, the linear dependence of χ as a function of inverse TODT (K−1) using χ(N)=10.5 was determined according to the following equation, where T is in K:

$$\chi = \frac{(135.9 \pm 8.4)}{T} - (0.147 \pm 0.015)$$

Figure 3:
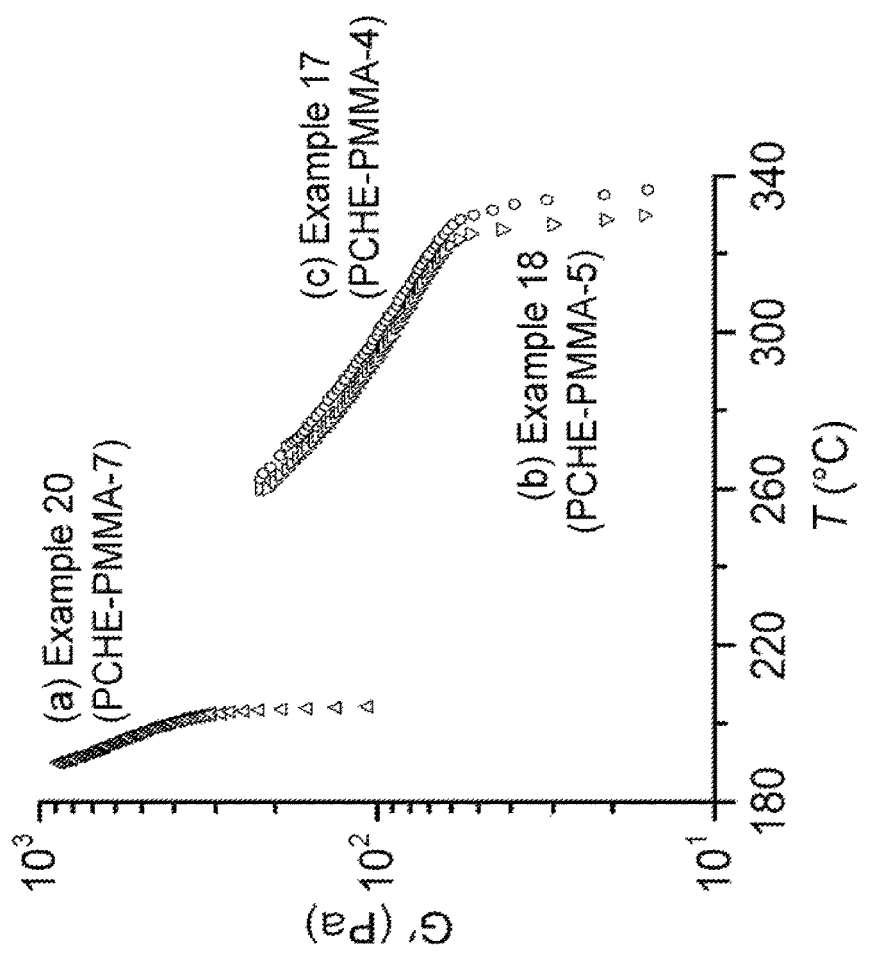
FIG. 3 is a graph depicting dynamic mechanical analysis (DMA) graphs for the Example 17 and Example 20.
Figure 4:
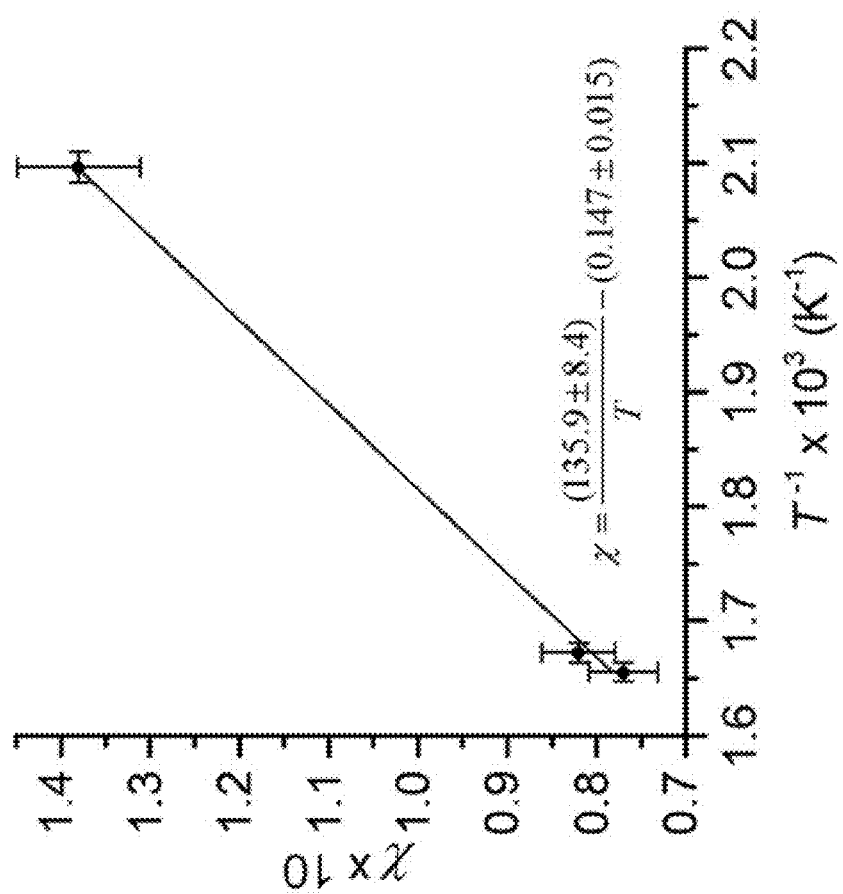
FIG. 4 is a graph that shows a linear dependence of $\chi$ as a function of inverse TODT (K−1) using $\chi(N)=10.5$.

The FIG. 3 shows dynamic mechanical spectroscopy (DMS) plots of the elastic modulus G'(Pa), upon heating for PCHE-PMMA block copolymers, including: (a) Example 20, PCHE-PMMA-7, N=76, ω=1 rad/s, strain=3%, rate=1° C./min; (b) Example 18, PCHE-PMMA-5, N=128, ω=100 rad/s, strain=10%, rate=10° C./min; and (c) Example 17, PCHE-PMMA-4, N=137, ω=100 rad/s, strain=10%, rate=10° C./min. The order-disorder transitions are observed by a drop in G' at 204, 325, and 33° C., respectively. The FIG. 4 shows a linear dependence of χ as a function of inverse $T_{ODT}$ (K$^{-1}$) using χ(N)=10.5. The y-error bars represent a standard±5% error of i\ while the x-error bars reflect a ±3° C. anticipated DMS instrumental error.

Example 22. Morphology Characterization of PCHE-PMMA Block Copolymers

Figure 5:
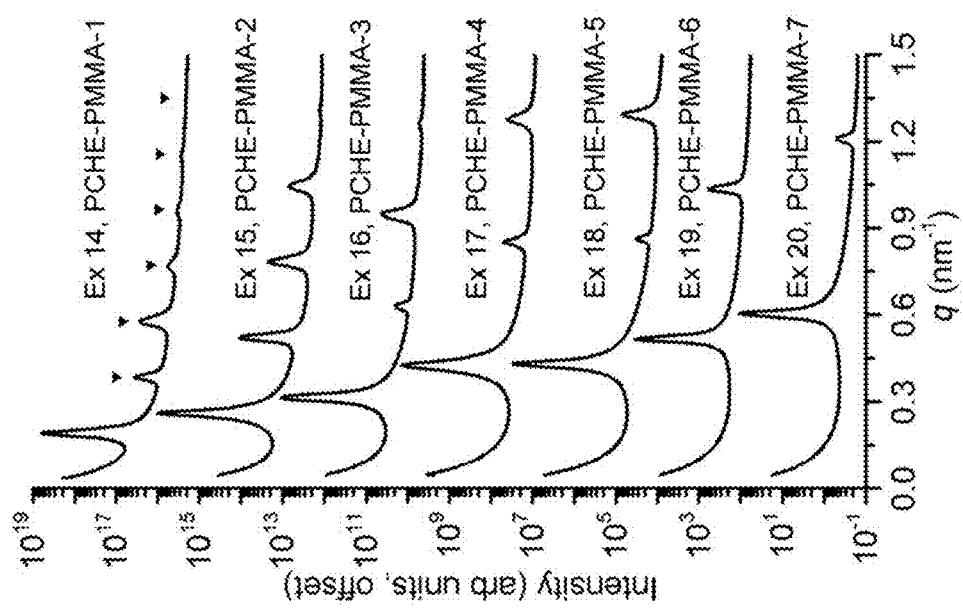
FIG. 5 is a graph depicting small angle xray scattering data (SAXS) for all of the compositions shown in the Table 3.

Solid state morphologies of the PCHE-PMMA block copolymers were characterized using small-angle X-ray scattering (SAXS). Pressed plaques of the PCHE-PMMA materials were annealed between 170 and 200° C. for a minimum of 14 hours under vacuum followed by slow cooling to 100° C. SAXS analysis at 25° C. was performed at the Advanced Photon Source (APS) at Argonne National Laboratory in Sector 5-ID-D beamline. The beamline is maintained by the Dow-Northwestern-Dupont Collaborative Access Team (DND-CAT). The source produces X-rays with a wavelength of 0.73 Å. Scattering intensities were monitored by a Mar 165 mm diameter CCD detector with a resolution of 2048×2048. The acquired 1-D SAXS patterns are shown in the FIG. 5. The FIG. 5 is a graph that shows SAXS 1-D patterns for PCHE-PMMA samples annealed between 170 and 200° C. for a minimum of 14 hours under vacuum followed by slow cooling to 100° C. All samples exhibit an ordered lamellar morphology with secondary scattering peaks (black triangles) at anticipated integer multiples of the principle scattering peak, q*.

All samples exhibit an ordered lamellar morphology with secondary scattering peaks (black triangles) at anticipated integer multiples of the principle scattering peak, q*. Domain spacings, D, were determined from the position of the principle lamellar scattering peak q*, where D=2π/q*, and are summarized in Table 3. While PS-PMMA block copolymers are incapable of forming morphologies with D<20 nm, these PCHE-PMMA block copolymers are capable of forming order nanostructures with D<11 nm. Example 20 shows that D=10.4 nm, and extrapolation to 110° C., where TODT~Tg, predicts ordered morphologies with D~8 nm. The scaling of D with N also follows the relationship expected in the strong segregation limit, where D~N0.67.

Example 2

This example demonstrates the use of a surface modification layer for PCHE-block-PMMA. The Table 1 below summarizes surface energies and surface tensions of materials that can be used to facilitate the formation of blocks perpendicular to the surface of the substrate for PCHE-block-PMMA. The PCHE-block-PMMA is disposed upon the substrate. Surface free energies of PCHE and PMMA are summarized in the first columns of the Table 1. A third polymer can be found to have a balanced surface tension between itself and PCHE, and itself and PMMA by first calculating the surface tension between PCHE and the third polymer and PMMA and the third polymer using the polar and dispersive forces of the PCHE and PMMA, where the surface tension ($\gamma$) between two polymers (i and j) is defined by the following equation (I), where $\sigma_{i,Total}$ is the total surface energy and $\sigma_d$ and $\sigma_p$ are the dispersive and polar components, respectively. in Equation (I):

$$\gamma_{i,j} = \sigma_{i,Total} + \sigma_{j,Total} - 4\frac{\sigma_{i,p}\sigma_{j,p}}{\sigma_{i,p}+\sigma_{j,p}} - 4\frac{\sigma_{i,d}\sigma_{j,d}}{\sigma_{i,d}+\sigma_{j,d}}, \quad (I)$$

The material can be considered neutral when the difference in these surface tensions between the third polymer and PCHE and the third polymer and PMMA, defined as |γx−γy| is equal to 0, i.e., it is to be minimized if it cannot be equal to 0. The desirable surface energy of the third polymer is calculated by adjusting its surface free energy values until the difference in surface tensions is equal to 0. This is referred to as the "optimal" value in Table 1, and any substrate with these surface energies can facilitate the formation of blocks perpendicular to the surface of the substrate.

In a similar manner, using the equation (I) and known surface energies, polymers can be found that have similar surface tension with the respective component polymers of PCHE-block-PMMA. Listed below in the Table 4, are some potential materials for formation of a surface modification layer. In the first set of numbers, the values of surface energy that provide the minimum difference in surface tension, |γx−γy| were calculated, thus representing an "optimal" third polymer with minimal difference in surface tension. Following this, polymeric materials with surface energies matching those of the optimal case were found. For example, the surface tension between poly(n-butylacrylate) (PnBA) and PCHE is very similar to that between PnBA and PMMA. Poly(tetramethylene oxide) (PTMO) also has similar surface tensions with PCHE and PMMA. Therefore, PnBA and PTMO are effective as surface modification layers for PCHE-block-PMMA. These materials can also be effective when incorporated into an additive copolymer that facilitates formation of blocks perpendicular to the surface of the substrate by forming a neutral layer on the surface of the block copolymer. Effective additive copolymers include block copolymers of PnBA and PTMO with surface free energy reducing moieties, such as polymer segments based on polydimethylsiloxane (PDMS), which has σi,Total=19.8 mN/m, or poly(heptadecafluorooctyl methacrylate) (PHDFOMA), which has σi,Total=15.3 mN/m, Useful additive copolymers include PnBA-block-PDMS, PnBA-block-PHDFOMA, PTMO-block-PDMS and PTMO-block-PHDFOMA.

TABLE 4

| Sample No. | Polymer I | $\sigma_{Total}$ (mN/m) | $\sigma_d$ (mN/m) | $\sigma_p$ (mN/m) | Polymer j | $\sigma_{Total}$ (mN/m) | $\sigma_d$ (mN/m) | $\sigma_p$ (mN/m) | $\gamma_{ij}$ (mN/m) | $|\gamma_x-\gamma_y|$ (mN/m) |
|---|---|---|---|---|---|---|---|---|---|---|
| #1 | PCHE | 28 | 28 | 0.0 | optimal | 31.8 | 28.0 | 3.9 | 3.9 | 0.0 |
|  | PMMA | 41.1 | 29.6 | 11.5 | optimal | 31.8 | 28.0 | 3.9 | 3.9 |  |
|  | PCHE | 28 | 28 | 0.0 | PnBA | 32.2 | 28.6 | 3.6 | 3.6 | 0.5 |
|  | PMMA | 41.1 | 29.6 | 11.5 | PnBA | 32.2 | 28.6 | 3.6 | 4.2 |  |
|  | PCHE | 28 | 28 | 0.0 | Poly (THF) | 31.9 | 27.4 | 4.5 | 4.5 | 1.4 |
|  | PMMA | 41.1 | 29.6 | 11.5 | Poly (THF) | 31.9 | 27.4 | 4.5 | 3.1 |  |

What is claimed is:

1. A block copolymer comprising:
   40 to 60 volume percent of a first block derived from a cyclo-alkyl vinyl monomer, a hydrogenated vinyl aromatic polymer or a hydrogenated vinyl pyridine polymer; and
   40 to 60 volume percent of a second block derived from an acrylate monomer; where the block copolymer comprises cylindrical and/or lamellar domains and has an interdomain spacing of less than or equal to about 30 nanometers; where the block copolymer comprises the first block and the second block.

2. The block copolymer of claim 1, where a chi parameter that measures interactions between the first block and the second block is greater than or equal to about 0.1 when measured at a temperature of 200° C. to 210° C.

3. The block copolymer of claim 1, where a chi parameter that measures interactions between the first block and the second block is greater than or equal to 0.05 when measured at a temperature of 200° C. to 210° C.

4. The block copolymer of claim 1, where the cyclo-alkyl vinyl monomer is vinylcyclohexane.

5. The block copolymer of claim 1, where the hydrogenated vinyl aromatic polymer is derived from a vinyl aromatic monomer; where the vinyl aromatic monomer is methylstyrene, p-methylstyrene, m-methylstyrene, α-methylstyrene, o-ethylstyrene, m-ethylstyrene, pethylstyrene, α-methyl-p-methylstyrene, 2,4-dimethylstyrene, monochlorostyrene, p-tertbutylstyrene, 4-tert-butylstyrene, vinylnaphthalene, acenaphthylene, or a combination comprising at least one of the foregoing vinyl aromatic monomers.

6. The block copolymer of claim 1, where the first block is poly(cyclohexylethylene), poly(2-vinyl piperadine), poly (4-vinylpiperadine) or a combination thereof.

7. The block copolymer of claim 1, where the acrylate monomer has a structure represented by formula (2):

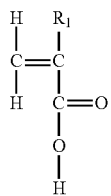

(2)

where R1 is a hydrogen or an alkyl group having 1 to 10 carbon atoms.

8. The block copolymer of claim 1, where the acrylate monomer has a structure represented by the formula (3):

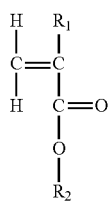

(3)

where R1 is a hydrogen or an alkyl group having 1 to 10 carbon atoms and R2 is a C1-10 alkyl, a C3-10 cycloalkyl, or a C7-10 aralkyl group.

9. The block copolymer of claim 1, where the acrylate monomer has a structure that comprises at least one fluorine atom substituent, where the structure represented by the formula (4):

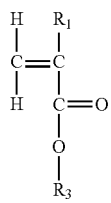

(4)

where R1 is a hydrogen, fluorine, a fluoroalkyl or an alkyl group having 1 to 10 carbon atoms and R3 is a C2-10 fluoroalkyl group.

10. The block copolymer of claim 1, where the second block is poly(methyl methacrylate).

* * * * *